United States Patent
Narayanaswamy et al.

(10) Patent No.: US 10,853,544 B2
(45) Date of Patent: Dec. 1, 2020

(54) SELECTIVE EXECUTION FOR PARTITIONED PARALLEL SIMULATIONS

(71) Applicant: Synopsys, Inc., Mountain View, CA (US)

(72) Inventors: Ramesh Narayanaswamy, Palo Alto, CA (US); Paraminder S. Sahai, San Jose, CA (US); Chiahon Chien, Saratoga, CA (US)

(73) Assignee: SYNOPSYS, INC., Mountain View, CA (US)

( * ) Notice: Subject to any disclaimer, the term of this patent is extended or adjusted under 35 U.S.C. 154(b) by 37 days.

(21) Appl. No.: 15/457,507

(22) Filed: Mar. 13, 2017

(65) Prior Publication Data

US 2017/0185700 A1    Jun. 29, 2017

Related U.S. Application Data

(63) Continuation of application No. 13/646,669, filed on Oct. 6, 2012, now abandoned.

(60) Provisional application No. 61/639,799, filed on Apr. 27, 2012.

(51) Int. Cl.
*G06F 30/20* (2020.01)
*G06F 30/3323* (2020.01)
*G06F 30/367* (2020.01)

(52) U.S. Cl.
CPC .......... *G06F 30/3323* (2020.01); *G06F 30/20* (2020.01); *G06F 30/367* (2020.01)

(58) Field of Classification Search
CPC . G06F 17/504; G06F 17/5036; G06F 17/5009
USPC .............................................. 703/15; 716/106
See application file for complete search history.

(56) References Cited

U.S. PATENT DOCUMENTS

| | | |
|---|---|---|
| 5,541,849 A | 7/1996 | Rostoker et al. |
| 5,544,066 A | 8/1996 | Rostoker et al. |
| 5,553,002 A | 9/1996 | Dangelo et al. |
| 5,555,201 A | 9/1996 | Dangelo et al. |
| 5,557,531 A | 9/1996 | Rostoker et al. |
| 5,572,436 A | 11/1996 | Dangelo et al. |
| 5,649,176 A * | 7/1997 | Selvidge ................... G06F 1/04 713/400 |
| 5,678,028 A | 10/1997 | Bershteyn et al. |
| 5,696,942 A | 12/1997 | Palnitkar et al. |
| 6,112,023 A | 8/2000 | Dave et al. |
| 6,212,668 B1 | 4/2001 | Tse et al. |

(Continued)

OTHER PUBLICATIONS

Chatterjee et al., "GCS: High Performance Gate Level Simulation with GPGPUs," Design, Automation & Test in Europe Conference & Exhibition; p. 1332-1337, (2009).

(Continued)

*Primary Examiner* — Juan C Ochoa
(74) *Attorney, Agent, or Firm* — Alston & Bird LLP

(57) ABSTRACT

Computer implemented techniques for the partitioned simulation of parallel architectures are disclosed. A high-level design for simulation is obtained. A graph representation for the high-level design is determined. The graph for the high-level design is partitioned into sub-graphs. A subset of the sub-graphs is selected for simulation based on input-change bits of the sub-graphs. The subset of the sub-graphs is subsequently evaluated on parallel architectures in order to produce a simulation result for the high-level design.

28 Claims, 10 Drawing Sheets

(56) References Cited

U.S. PATENT DOCUMENTS

| | | | |
|---|---|---|---|
| 6,216,252 B1 | 4/2001 | Dangelo et al. | |
| 6,230,303 B1 | 5/2001 | Dave | |
| 6,470,480 B2 | 10/2002 | Ganesan et al. | |
| 6,480,988 B2 | 11/2002 | Ganesan et al. | |
| 6,487,704 B1 | 11/2002 | McNamara et al. | |
| 6,625,786 B2 | 9/2003 | Ganesan et al. | |
| 6,629,297 B2 | 9/2003 | Ganesan et al. | |
| 6,635,446 B1 | 10/2003 | Ramesh et al. | |
| 6,691,287 B2 | 2/2004 | Ganesan et al. | |
| 6,927,318 B2 | 8/2005 | Ramesh et al. | |
| 7,143,021 B1 | 11/2006 | McGaughy et al. | |
| 7,257,525 B2 | 8/2007 | McGaughy | |
| 7,328,143 B2 | 2/2008 | McGaughy | |
| 7,370,312 B1 | 5/2008 | Steckel | |
| 7,402,725 B2 | 7/2008 | Ramesh et al. | |
| 7,415,403 B2 | 8/2008 | McGaughy | |
| 7,509,602 B2 | 3/2009 | Ganesan et al. | |
| 7,548,842 B2 | 6/2009 | Ganesan et al. | |
| 7,562,325 B1* | 7/2009 | Arbel | G06F 30/327 716/125 |
| 7,673,263 B2 | 3/2010 | Jain | |
| 7,805,697 B2* | 9/2010 | Wood | G06F 30/327 716/113 |
| 8,418,115 B1 | 4/2013 | Tom et al. | |
| 8,604,831 B2* | 12/2013 | Myers | G06F 1/10 326/93 |
| 8,738,349 B2 | 5/2014 | Bertacco et al. | |
| 8,738,559 B2 | 5/2014 | Delling et al. | |
| 2002/0112217 A1 | 8/2002 | Ganesan et al. | |
| 2002/0116689 A1 | 8/2002 | Ganesan et al. | |
| 2002/0116693 A1 | 8/2002 | Ganesan et al. | |
| 2002/0120907 A1 | 8/2002 | Ganesan et al. | |
| 2002/0199211 A1 | 12/2002 | Narayanaswamy et al. | |
| 2003/0041308 A1 | 2/2003 | Ganesan et al. | |
| 2005/0091025 A1 | 4/2005 | Wilson et al. | |
| 2006/0150135 A1* | 7/2006 | Hamada | G06F 30/327 716/103 |
| 2006/0277019 A1 | 12/2006 | Ganesan et al. | |
| 2006/0277020 A1 | 12/2006 | Ganesan et al. | |
| 2006/0277234 A1 | 12/2006 | Ganesan et al. | |
| 2006/0277428 A1 | 12/2006 | Ganesan et al. | |
| 2006/0294611 A1 | 12/2006 | Narayanaswamy et al. | |
| 2007/0044079 A1 | 2/2007 | Ganesan et al. | |
| 2007/0143719 A1* | 6/2007 | Chopra | G06F 30/30 716/113 |
| 2007/0294075 A1 | 12/2007 | Ganesan et al. | |
| 2009/0164198 A1 | 6/2009 | Tan et al. | |
| 2010/0280814 A1 | 11/2010 | Rabinovitch et al. | |
| 2011/0257955 A1 | 10/2011 | Bertacco et al. | |
| 2013/0290919 A1 | 10/2013 | Narayanaswamy et al. | |

OTHER PUBLICATIONS

Chatterjee et al.; "Gate-level simulation with GPU computing," ACM Transactions on Design Automation of Electronic Systems, Article 30, 16(3):Article 30, 26 pages, (2011).

Cong et al., "Instruction Set Extension with Shadow Registers for Configurable Processors," Proceedings of the 2005 ACM/SIGDA 13th international, FPGA '05, pp. 99-106, (2005).

Lewis, "A hierarchical compiled code event-driven logic simulator," IEEE Transactions On Computer-Aided Design, 10(6):726-737 (1991).

Namballa et al., "Control and Data Flow Graph Extraction for High-Level Synthesis," Proceedings of the IEEE Computer Society Annual Symposium on VLSI1 Emerging Trends in VLSI Systems Design (ISVLSI'04), ISSN: 0-7695-2097, 6 pages, (2004).

U.S. Appl. No. 13/646,669, Final Office Action dated Aug. 10, 2015.

U.S. Appl. No. 13/646,669, Final Office Action dated Sep. 13, 2016.

U.S. Appl. No. 13/646,669, Non-Final Office Action dated Mar. 31, 2016.

U.S. Appl. No. 13/646,669, Non-Final Office Action dated Apr. 2, 2015.

* cited by examiner

SELECTIVE EXECUTION FOR PARTITIONED PARALLEL SIMULATIONS

CROSS-REFERENCES TO RELATED APPLICATION

The present application is a continuation application of U.S. application Ser. No. 13/646,669, filed Oct. 6, 2012, which claims benefit under 35 § U.S.C. 119(e) of U.S. Provisional Patent Application No. 61/639,799, filed Apr. 27, 2012, each of which is incorporated herein by reference in their entirety.

FIELD OF ART

This application relates generally to semiconductor circuit simulation and more particularly to selective execution of partitioned parallel simulation.

BACKGROUND

Modern electronic systems designs contain numerous components including digital, analog, and high frequency components, all of which can be problematic to design. The design process may comprise top-down decomposition and/or bottom-up assembly. Feature sizes of the components making up the electronic systems now are routinely smaller than the wavelength of visible light. In addition, the rapid change of the market and consumer demands drives ever-increasing performance, feature sets, versatility, and various other system factors which inject contradictory design requirements into design processes. Logic systems are routinely constructed from tens or even hundreds of millions of transistors. System designers are required to balance system performance, physical size, architectural complexity, power consumption, heat dissipation, fabrication complexity, and cost, to name only a few. Each of the related design decisions drive profound impacts on the resulting design. To handle the design complexity, developers create specifications around which to design their systems. The specifications attempt to balance the many disparate demands being made of the logic system and to contain what can easily be exploding design complexity.

Systems may be described at a variety of levels of abstraction ranging from low-level transistor layouts to high-level description languages. Most designers describe and design their electronic systems at a high-level of abstraction using an IEEE standard hardware description language (HDL) such as Verilog, SystemVerilog™, or VHDL. The high-level HDL is easier for developers to comprehend, especially for a vast system, and may describe highly complex concepts that are difficult to grasp using a lower level of abstraction. The HDL description may be converted into other levels of abstraction as is helpful to the developers. For example, a high-level description may be converted to a logic-level register transfer level (RTL) description, a gate-level (GL) description, a layout-level description, or a mask-level description. Each lower abstraction level introduces more detail into the design description. The lower-levels of abstraction may be generated automatically by computer, derived from a design library, or created by another design automation technique. Therefore, it is critical to ensure that the performance of the resulting lower-level designs is still capable of matching the requirements of the system's specification. The process of comparing a system design to a design specification (or one level of abstraction to another) can be called verification. Verification of modern electronic systems can ensure that a device under test (DUT) is simulated so that the behavior of the DUT is shown to match a system specification for the electronic design.

SUMMARY

Techniques implemented for the verification of integrated circuits are required to stimulate the device under test (DUT) to a sufficient extent to ensure that the device matches a design specification. Further, the verification process, which is by necessity computationally intensive, must be undertaken in such a way as to minimize both test duration and computer resource utilization. A computer-implemented method for design simulation is disclosed comprising: obtaining a high-level design for simulation; determining a graph representation for the high-level design; partitioning the graph representation into sub-graphs; selecting a subset of the sub-graphs for simulation based on input-change bits; and evaluating the subset of the sub-graphs to produce a simulation result for the high-level design.

The method may further comprise propagating the simulation result, based on the evaluating of the subset of the sub-graphs, to a remainder of the graph representation for further simulation. The subset of the sub-graphs for simulation may be selected based on an input-change bit, for each sub-graph in the subset of the sub-graphs, being set to true. The partitioning may further comprise determining sub-graphs based on levels of logic. The partitioning into sub-graphs may be based on reducing a number of signals crossing sub-graph boundaries. The method may further comprise using one or more of the input-change bits on a level as part of the selecting of the subset for simulation. The evaluating may be based on an oblivious simulation model. The method may further comprise allocating processes from the oblivious simulation model to a plurality of processors. The method may further comprise selectively evaluating the processes based on an input change bit set being set to valid. The graph representation may include a control data flow graph. The control data flow graph may include a graph of a combinational region of the high-level design and a state region of the high-level design. The partitioning may include creating value locality. The partitioning may include creating event change locality. The partitioning may include balancing of levels. The partitioning may include collecting of readers of a simulation value. The partitioning may include separating primitives evenly across clusters within a level. The partitioning may include clustering sibling primitives. The method may further comprise modifying clock gating. The modifying clock gating may include moving gating to storage elements. The modifying clock gating may include eliminating a clock gate to a combinational logic portion. The modifying clock gating may be only for simulation purposes. The clock gating may be restructured to combine phases and to occur on an active edge of clock. The method may further comprise determining that an output of one of the sub-graphs has a change of state and copying that change of state to a processor where a process for a second sub-graph uses that change of state as input to the second sub-graph. The method may further comprise copying a sequence of changes of state for that output of one of the sub-graphs and using the sequence as a series of inputs to the second sub-graph. The method may further comprise copying the high-level design and simulating the high-level design as well as its copy on at least two different processors. The copying may be performed to accomplish the simulating. The method may further comprise maintaining primitives with the same function in a single cluster within the copy of the high-level design.

In embodiments, a computer system for design simulation may comprise: a memory which stores instructions; one or more processors coupled to the memory wherein the one or more processors are configured to: obtain a high-level design for simulation; determine a graph representation for the high-level design; partition the graph representation into sub-graphs; select a subset of the sub-graphs for simulation based on input-change bits; and evaluate the subset of the sub-graphs to produce a simulation result for the high-level design. In some embodiments, a computer program product embodied in a non-transitory computer readable medium for design simulation may comprise: code for obtaining a high-level design for simulation; code for determining a graph representation for the high-level design; code for partitioning the graph representation into sub-graphs; code for selecting a subset of the sub-graphs for simulation based on input-change bits; and code for evaluating the subset of the sub-graphs to produce a simulation result for the high-level design Various features, aspects, and advantages of various embodiments will become more apparent from the following further description.

BRIEF DESCRIPTION OF THE DRAWINGS

The following detailed description of certain embodiments may be understood by reference to the following figures wherein.

DETAILED DESCRIPTION

Figure 1:
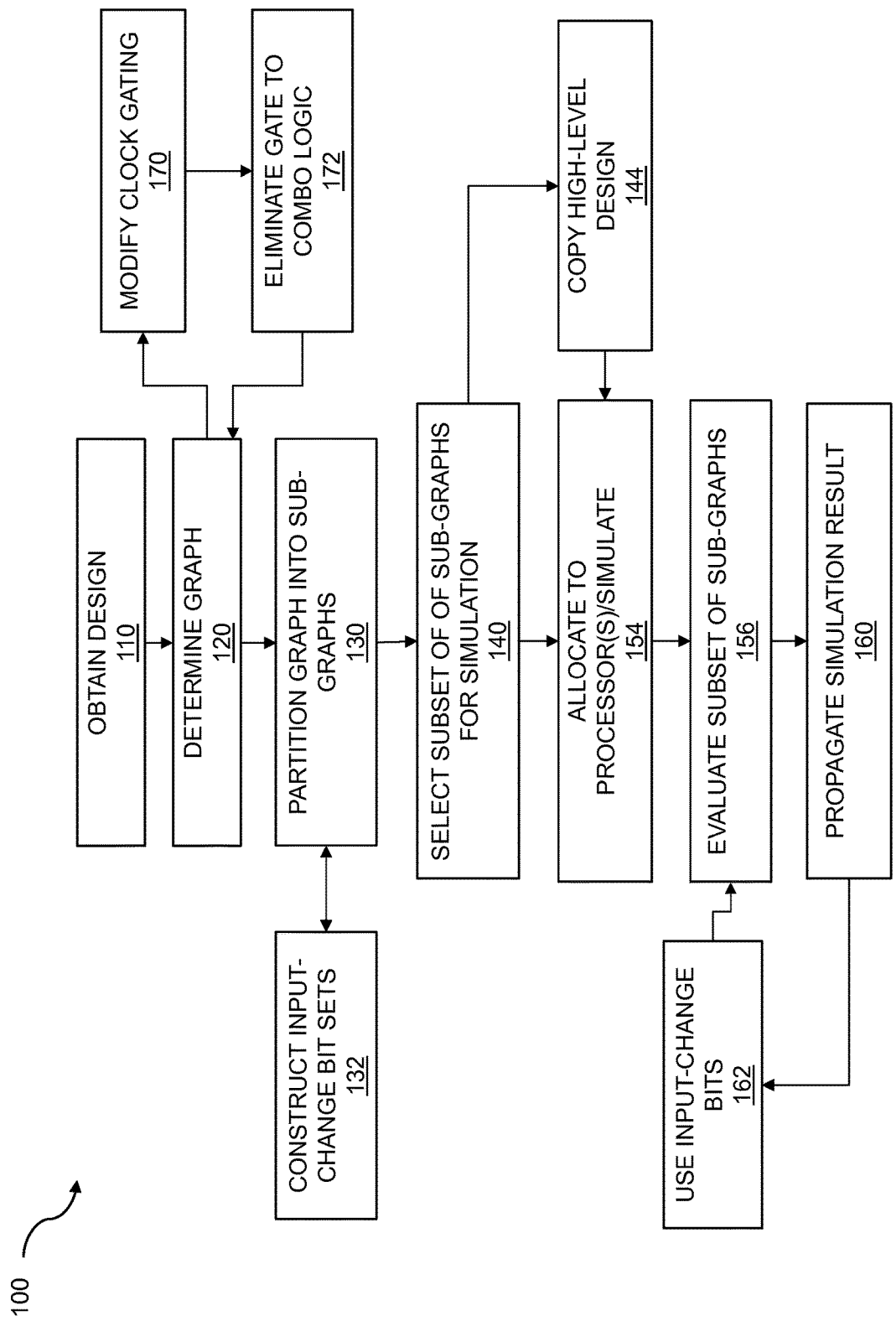
FIG. 1 is a flow diagram for partitioned simulation.

Electronic circuit designs are vastly complex systems. Verification of these systems, and portions thereof, is critical to produce properly functioning logic designs. Many simulation techniques, including event driven simulation and oblivious simulation, have been proposed to aid in this verification process. Event driven simulation, as opposed to oblivious simulation, can maintain a time-ordered queue of waiting processes. Events are added to the list at various times, and are typically processed in the order in which they arrive. Processing an event may generate more events or alter the order of the list of pending events. The components of the electronic system which experience value changes (i.e. the one or more inputs that have changed) are added to the queue of pending processes. Thus, simulation computation is limited to design components which undergo input changes. In contrast, oblivious simulation evaluates all components of the design regardless of whether or not a given component has experienced a value change. Changes to input values are not monitored, and no queue insertion is performed. However, in this type of simulation, a computation of every component is performed for every simulation process; this often leads to redundant and unnecessary computations. Thus, the choice of a simulation approach and how that approach is implemented is critical to minimizing simulation time while maximizing effectiveness.

Both the event driven and oblivious simulation approaches may be parallelized, though the process is different in each approach. Parallel event driven simulation employs multiple time-ordered queues and processes, and assigns sections of the design to a time-ordered queue running on a processor. Since the time-ordered queues must be chronologically synchronized, this approach is often limited to few processors. It does not scale to large numbers of processors because synchronization costs are prohibitively high and processor work assignments are uneven, thus saturating one processor with tasks while others remain idle. On the other hand, parallel oblivious simulation simplifies queue synchronization because only a single synchronization is required per level of the simulation model. Parallel oblivious simulation does perform redundant (i.e. unnecessary) operations. However, in a simulation with many value changes per design clock cycle or simulation cycle, parallel oblivious simulation is more efficient than parallel event driven simulation because of lower computational and synchronization demands.

The oblivious simulation model presents a static simulation view which both allows for efficient partitioning under multiple constraints and efficient allocation of tasks to clusters of processors. The oblivious model may be instrumented for selective execution of processes, thus reducing computational overhead by removing from a simulation cycle static portions of the model which do not change in a given cycle. A control data flow graph (CDFG) representing the description of the electronic system can be folded into a graph of the combinational and state regions. The CDFG may then be partitioned statically in order to create a locality of read and write values, balance computations by level, determine event change locality, and calculate the number of unique node (primitive) type reductions per partition. Such partitioning is accomplished by collecting most or all readers of a simulation value into the same cluster, partitioning primitives evenly across clusters, clustering "sibling" primitive instances together, limiting the number of unique primitives generated, and clustering for a small number of unique primitives. The statically partitioned CDFG can be instrumented with a single input change bit per cluster of nodes in a given level. Thus, such selective evaluation can skip the evaluation of a cluster for which the change bit is false. In this system, a collection of change bits is gathered in a bit set that is both updated and traversed in parallel by allocating each bit to a processing thread.

In the disclosed concept, a control data flow Graph (CDFG) may be assigned to an RTL representation of a high level design and partitioning performed. Each partitioning constraint is satisfied by collecting most or all readers of a particular simulation value into the same cluster. This reduces the number of necessary writes by the result writer, as well as evenly partitioning primitives in a level across clusters. Clustering of sibling primitive instances from multiple instances of large user blocks (e.g. four program counter (PC) incrementer primitives from a four CPU core model may be clustered together) may be performed as well as limiting the number of unique primitives being generated and clustered to a small number. Instrumenting the CDFG with an input change bit per cluster of nodes in a level can be helpful. Selective evaluation can then evaluate a cluster of nodes if the input change bit is true and bypass evaluation of a cluster of nodes if the input change bit is false. Thus, selective evaluation minimizes unnecessary evaluation by skipping the evaluation of clusters for which the input change bit is false. In addition, the use of an input change bit set per level can be executed efficiently on a parallel processor. An input change bit may have many writers, where all writers are able to make a lock-free write of the value "true" to the input change bit. (e.g. multiple writes of "true" to a single bit). The disclosed concept is more efficient than creating an event queue which requires a lock and/or the use of atomics. The disclosed concept thus provides a reduction in computational complexity.

In some embodiments, clock gating check circuits are moved to storage elements that are controlled by the clock or clocks. As a result, gated clock circuits which required more than one clock cycle for evaluation may be evaluated in one clock cycle. The result is a reduced numbers of evaluation steps, and thus an improvement in computational efficiency. Safe clock gating captures the clock enable signal on the inactive edge of the clock. The registers implemented in the designs of various cores are sensitive only to the active edge of the clock. Since there is little simulation activity on the inactive edge of the clock, high overhead associated with parallel simulation may be eliminated for the inactive clock edge.

In the disclosed concept, the topology of the safe clock gating and the clock enable signals may be identified. The clock and clock enable signals can be moved into the process or processes which consume the gated clock. Clock gating processes which are sensitive to the inactive edge of the clock, and the gated clock net, may be removed. Thus, the design's sensitivity to the inactive edge of the clock is removed. Very low simulation activity is thereby eliminated. As a result, the parallel simulation overhead of many synchronization barriers required to execute a simulation time step for the inactive edge of the clock is removed. Gated clock logic which is on the inactive edge of the clock is removed, and clock gating is fused into the process that is on the active edge of the clock. Improved simulation efficiency takes advantage of parallel computing architectures such as a graphics processing unit (GPU).

FIG. 1 is a flow diagram for partitioned simulation. A flow 100 is described for selective execution of partitioned parallel simulation. The flow 100 comprises a computer-implemented method for design simulation. Effective parallel simulation is critical to design verification. Parallel simulation can be performed on parallel architectures such as parallel processors, grid computers, and graphics processor units (GPUs for example). The purpose of verification is to ensure that an electronic system design matches a predetermined specification. Various scheduling algorithms exist such as event driven simulation and the oblivious algorithm simulation. In event driven simulation, a time-order process queue is maintained. Components of a design which undergo value changes are inserted into the queue. As a result, computation is limited to the evaluation of parts of the design that have to be updated.

In oblivious simulation, all components of the design are evaluated. Component evaluation takes place whether the components undergoes a value change or not. Computation of the various components is simpler because value changes are not checked, and there is no queue insertion process that must be handled. However, redundant computation is the result when components which did not undergo value changes are evaluated.

In the disclosed concept, clock gating plays a role in simulation efficiency. A gated clock may be derived from a main clock and may be implemented to disable regions of a design under control of a clock. Each gated clock in turn may be used to derive sub-gated clocks. Such a hierarchy of gated clocks may serialize the evaluation of a simulation model. The enable of a gated clock may be computed in one phase, which may trigger a change on a gated clock signal, which in turn may be evaluated in a second phase. If the clock gating check is moved into a storage element that may be controlled by the clock, then the evaluation may be done in one phase instead of two. Parallel evaluation may be increased, and the overhead of starting a second phase of evaluation may be removed.

The flow 100 includes obtaining a high-level design 110 for simulation. Design simulation is a crucial step in the design, analysis, and verification of an electronic system. In embodiments, the obtained design may be a high level design written in any of a variety of languages such as Verilog™, VHDL™, SystemVerilog™, SystemC™, or other design language.

The flow 100 continues with determining a graph representation 120 for the high-level design. A high-level design 110 may be represented by a graph. The graph may be manipulated in a variety of ways for simulation purposes. The graph may include a control data flow graph. In embodiments, a control data flow graph (CDFG) may be determined for an RTL or behavioral representation of a high-level design. A control data flow graph may include a graph of a combinational region of the high-level design and a state region of the high-level design. Other graphical representations may be determined for a representation of a high-level design including a directed graph, an acyclic directed graph, a Petri Net, or other graph appropriate to the design problem.

The flow 100 continues with partitioning the graph 130 into sub-graphs. A graph may be partitioned into sub-graphs 130 for simulation purposes. A graph can be partitioned into sub-graphs by a number of means, including static means, arbitrary means, and the like. Static partitioning, for example, may be based on creating value read/write locality, balancing computation by level, creating event-change locality, reducing unique node (or primitive) types in a given partition, and the like. The partitioning may include determining sub-graphs based on reducing a number of signals crossing sub-graph boundaries. Arbitrary partitioning may be based on random, ad hoc, heuristic, or other means. The flow 100 may include constructing input-change bit sets 132. An input-change bit may be a memory element that is added to a design to record when an input to a portion of the design changes state. By knowing that an input to the portion has changed, then that portion of the design can be re-evaluated and an output from that portion may change. The input-change bit may only be inserted into a design for simulation purposes. In some embodiments, the input-change bit can be an artifact and is actually a memory element somewhere other than the design which aids in simulation. A set of input-change bits may be assembled to track multiple portions of the design under simulation. The set may be optimized to cover proper portions of the design as would be appropriate to partition for simulation in separate sections. The partitioning may include determining sub-graphs based on levels of logic where the levels of logic may be successive stages.

The flow 100 continues with selecting a subset of the sub-graphs for simulation 140. The selection may be based on input-change bits. A partition or subset of a graph may be instrumented with an input change bit. An input change bit may be associated with a vertex (node) of a graph, or may be associated with a cluster of nodes of a graph. The flow 100 may further comprise using one or more of the input change bits on a level as part of the selecting of the subset for simulation. An input change bit may indicate that one or more inputs to a partition or subset of a graph (e.g. a sub-graph) have changed over some time period. The selection of a subset of sub-graphs may further comprise selectively evaluating the processes based on an input change bit set being set to true (or valid). Selection of a subset of sub-graphs may be made based on a change in status of one or more input change bits. Selection of a subset of the sub-graphs may be selected for execution based on level, on an active edge of a clock, and the like.

The flow 100 may include allocating the subset of the sub-graphs for simulation 140 to one or more processors 154. The subset may then in turn be simulated. In some embodiments, the flow 100 includes copying the high-level design 144 and simulating the high-level design as well as its copy on at least two different processors. The flow 100 continues with evaluating the subset of the sub-graphs 156 to produce a simulation result for the high-level design. A subset of sub-graphs which may be selected based on using one or more input-change bits 162 to determine a change of status. A change in status may cause re-evaluation of a subset of the sub-graphs 156. In embodiments, the subset of the sub-graphs for simulation are selected based on the input-change bit for each sub-graph in the subset of the sub-graphs being set to true. The processors used in such simulations can include one or more copies of a core, a multicore processor, a graphics processing unit (GPU), a parallel processor, a grid computer, and the like. Subsets of sub-graphs may indicate an unchanged status of one or more of the input change bits providing selective simulation of only those subsets of sub-graphs whose input change bits changed status. This strategy thereby reduces computation requirements by ignoring subsets of sub-graphs without a change of status in their input change bits. Various approaches can be used for the evaluation process. Event driven simulation may be used. In other embodiments, the evaluating may be based on an oblivious simulation approach with the simulations being executed on one or more processors. The allocating of processes from the oblivious simulation approach can be to a plurality of processors. Such allocation of processes to a plurality of processors may be based on the input-change bit or bits thereby including evaluation of a subset of the sub-graphs.

The flow 100 continues with propagating the simulation result 160, based on the evaluating of the subset of the sub-graphs 156, to a remainder of the graph for further simulation. A verification process may involve iterating the simulation process. Such iteration may occur for both verification processes based on event driven simulation and for verification based on Oblivious Simulation. Iterating the simulation process may cause a change in the order in which a process or processes are evaluated.

The flow 100 may further comprise modifying the clock gating 170. While determining a graph 120 for evaluation, a portion of the design may be identified with clock gating which is inefficient from a simulation perspective. In such a case the clock gating may be modified 170, perhaps only for simulation purposes. In some designs, a clock signal may be gated for a variety of reasons including to reduce power consumption. With oblivious simulation an inefficient simulation may result if inactive segments of a design are nonetheless simulated. Safe clock gating may capture a clock enable signal on an inactive edge of a clock as can be seen with certain register designs. Using parallel simulation in this case may incur a high overhead and thus be inefficient. Modification of the clock signal may be undertaken in order to reduce simulation during low activity. In embodiments, the modifying of the clock gating may include moving gating to storage elements. For example, a clock signal and a clock enable signal may be recognized. These signals may be moved to the process which consumes a gated clock. Further, removing sensitive clock gating processes to an inactive edge of a clock may further reduce simulation requirements. In embodiments, the modifying may include changing the design, while in other embodiments the modifying of the clock gating may only be for simulation purposes.

The modifying of the clock gating may include eliminating a clock gate to a combinational logic portion 172. A gated clock may be derived from a main clock and, for example, may be employed to disable regions of a design under a clock control. Each gated clock may in turn be used to derive sub-gated clocks. Such a hierarchy of gated clocks may serialize the evaluation of a simulation model. The clock gating may be restructured to combine phases and to occur on the active edge of clock. For example, the enable signal of a gated clock may be computed in one phase. This single phase computation may trigger a change on a gated clock signal, which may in turn necessitate evaluation using a second phase. If the clock gating check were to be moved to a storage element controlled, in embodiments, by a clock, then an evaluation may be done in one clock phase. A combination of clock phases may increase parallel evaluation efficiency, and may remove the overhead of starting a second phase of evaluation. The updated clock gating can be reflected in the graph which was determined. Various steps in the flow 100 may be changed in order, repeated, omitted, or the like without departing from the disclosed inventive concepts. Various embodiments of the flow 100 may be included in a computer program product embodied in a non-transitory computer readable medium that includes code executable by one or more processors.

Figure 2:
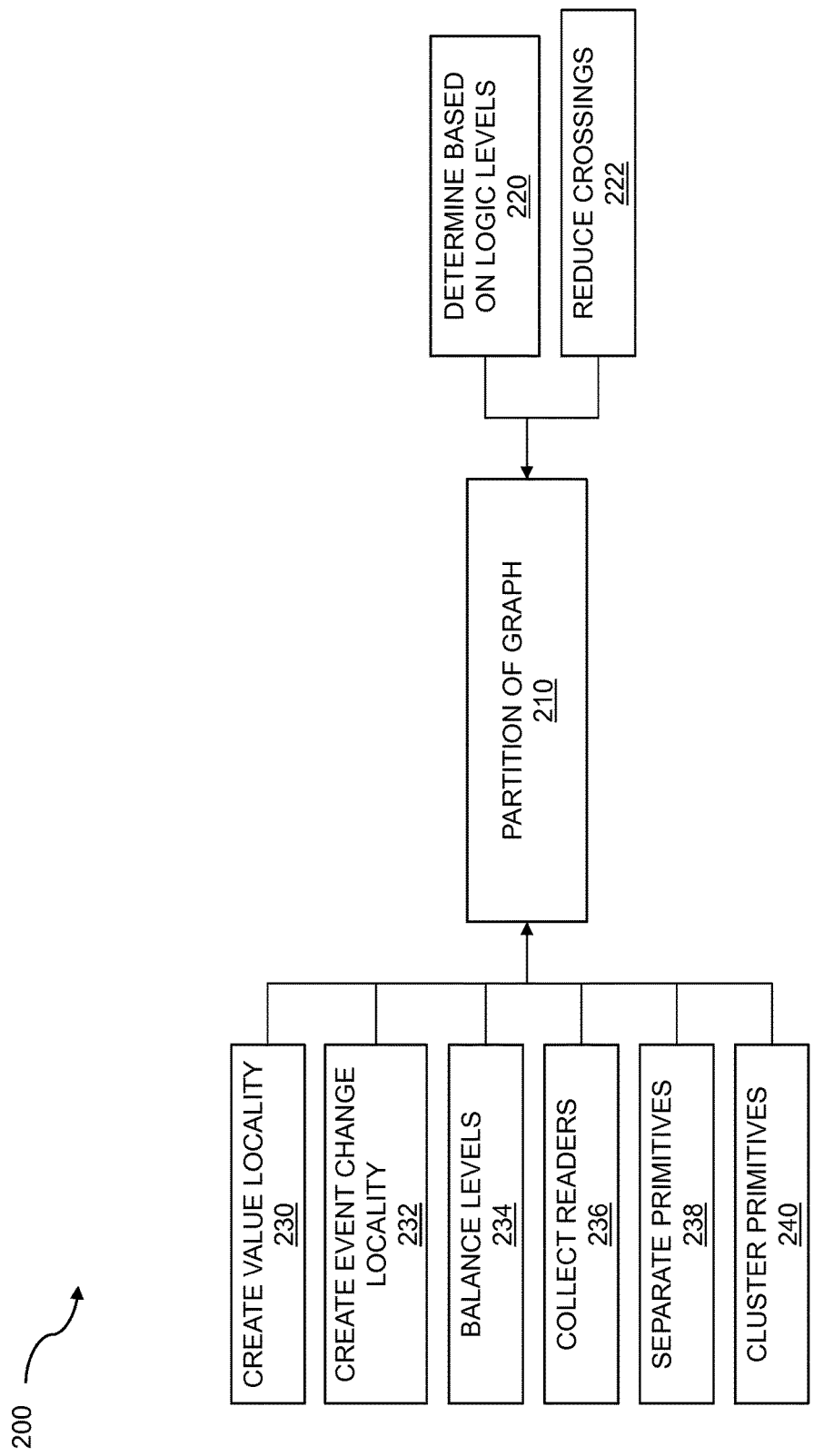
FIG. 2 is a flow diagram for partitioning.

FIG. 2 is a flow diagram for partitioning. A flow 200 may continue or be part of the previous flow 100. In some embodiments, the flow 200 stands on its own and works from pre-existing system designs, graphs, and the like. A graph representing a system design is obtained. A graph may be partitioned 210 to create a set of sub-graphs. The graph may be any of a variety of graphs including a control data flow graph (CDFG), a directed graph, an acyclic directed graph, a Petri Net, or other graph appropriate to the design problem. The graph may be partitioned into various sub-graphs by a variety of means including arbitrary means, static mean, ad hoc means, heuristic means, and the like.

In embodiments, partitioning of a graph into sub-graphs may be determined based on logic levels 220. A design may comprise one or more levels of logic. In addition, simulation models may cause a simulation of a system to be performed in one or more levels. However, depending on simulation model, the computation required at a given level might be significantly different from that required at another level. For example, the use of an event driven simulation model may cause an uneven work assignment from level to level as a result of partitioning of a graph. As a further example, the evaluating may be based on an oblivious simulation model. Use of an Oblivious model may further comprise allocating processes from the oblivious simulation model to a plurality of processors. oblivious simulation may not suffer from work starvation on one or more processors. Synchronization may be simpler since a single synchronization per level of the model is sufficient. However, parallel oblivious simulation may perform redundant computation since all logic blocks are evaluated each simulation cycle. When the number of value changes per design clock is low, parallel oblivious simulation may be slower than serial event driven simulation.

In embodiments, a graph may be partitioned into sub-graphs based on a reduction of sub-graph crossings 222. Sub-graph crossings may refer to the number of signals which flow among sub-graphs. To minimize the number of sub-graph crossings, an evaluation region may be partitioned into sub-regions subject to constraints of a given design. Signal crossings among sub-regions may be minimized if most values may be produced and consumed within a sub-region; many consumers of a signal may be moved to a receiving sub-region when a signal crosses sub-regions; and the number of primitives in different sub-regions may roughly equal.

Partitioning of a graph into sub-graphs may be based on a variety of parameters. For example, the partitioning may include creating value locality 230. To create value locality, signal producers and related signal consumers may be moved to the same partition. Producing and consuming signals within a given partition may reduce sub-graph crossings. For example, creating value read/write locality may permit data production and data consumption to remain local to a given processor assigned, in embodiments, to execute the sub-graph.

In embodiments, the partitioning may include creating event change locality 232. Aggregate selective evaluation (ASE) may evaluate all primitives in a block even if only one input to the block may have changed. One may choose to cluster many primitives that change at a given simulation time into a single block to improve the efficiency of ASE and to improve computational efficiency. In such a partitioning scheme, a variety of primitives may be clustered together so that evaluation of all primitives within a partition remains relevant to a given simulation rather than simply being wasted cycles.

In embodiments, the partitioning includes balancing of levels 234. Such a partitioning may balance a given workload in three phases, such as fetching input values, evaluating primitives, and checking and writing output changes, for example. In embodiments, the partitioning includes collecting of readers 236 of a simulation value. Simulation values may be created by producers, and consumed by readers. Computational efficiencies may result if a graph is divided into sub-graphs based on clustering of producers and readers. Efficiencies may result from assigning such sub-graphs to the same processors, because computational (e.g. data read/write) efficiencies from reduced processing overhead may result.

In embodiments, the partitioning includes separating primitives 238 evenly across clusters within a level. A processor cluster or a sub cluster may support single instruction and/or multiple data (SIMD) instructions. A SIMD instruction may efficiently compute, for example, 8, 16, 32, or more operations of the same primitive type, such as 16 additions in a single clock cycle of the CPU. To exploit SIMD instructions, a single primitive type or a small set of primitive types may be allocated to a cluster or sub-cluster.

In embodiments, the partitioning includes clustering sibling primitives 240. Clustering of sibling processes may be an embodiment of change locality. In a given design model, multiple component instantiations can occur. For example, an 8-core CPU may comprise eight instantiations of a component Core. A component which may perform an operation in Core may appear eight times in the CPU. For example, an incrementer—which may increment a program counter (PC) by 1 in a core—appears eight times in a CPU. In this example, these multiple instances of PCs are referred to as "siblings." Since sibling primitives have a high probability of simultaneous input changes, then those sibling primitives can be clustered together into a given partition of a graph—a sub-graph.

A user may run thousands of tests on a single simulation model. Each of these tests may form an execution sequence. By creating a simulation model which runs 2, 4, or more copies of the simulation model at a time, one may increase parallel efficiency and achieve better utilization of a model. Such simulation may follow a process such as: obtain a simulation model then obtain 2, 4, or more copies of the simulation model data, one copy for each test to be supported by a multi-test simulation model. By having multiple copies different stimulus can be applied to the copies to evaluate different tests. In some embodiments, design representations can be shared across the copies. Likewise circuit structures can be shared across the copies.

A simulation model may comprise an interconnection of simple primitives. Simple primitives may have roughly equal computational and communication requirements. For example, a description of a logic design at a gate level may be in terms of simple primitives such as AND, OR, and NOT gates, flip-flops, latches, and the like. An RTL description in a high-level language such as Verilog™, VHDL™, System-Verilog™, SystemC™, or other design language, may be decomposed into primitives. Higher level functions of arbitrary width such as multipliers, address, and the like, may be decomposed into components comprising fixed widths such as 32 or 64 bits, for example. Selectors comprising an arbitrary number of inputs may be decomposed into components comprising a fixed number of inputs such as 3, 5, and the like. Primitives may be clustered together for a variety of reasons that may be related to design and/or simulation. Such primitives can comprise a significant portion of a graph or sub-graph for evaluation. Various steps in the flow 200 may be changed in order, repeated, omitted, or the like without departing from the disclosed inventive concepts. Various embodiments of the flow 200 may be included in a computer program product embodied in a non-transitory computer readable medium that includes code executable by one or more processors.

Figure 3:
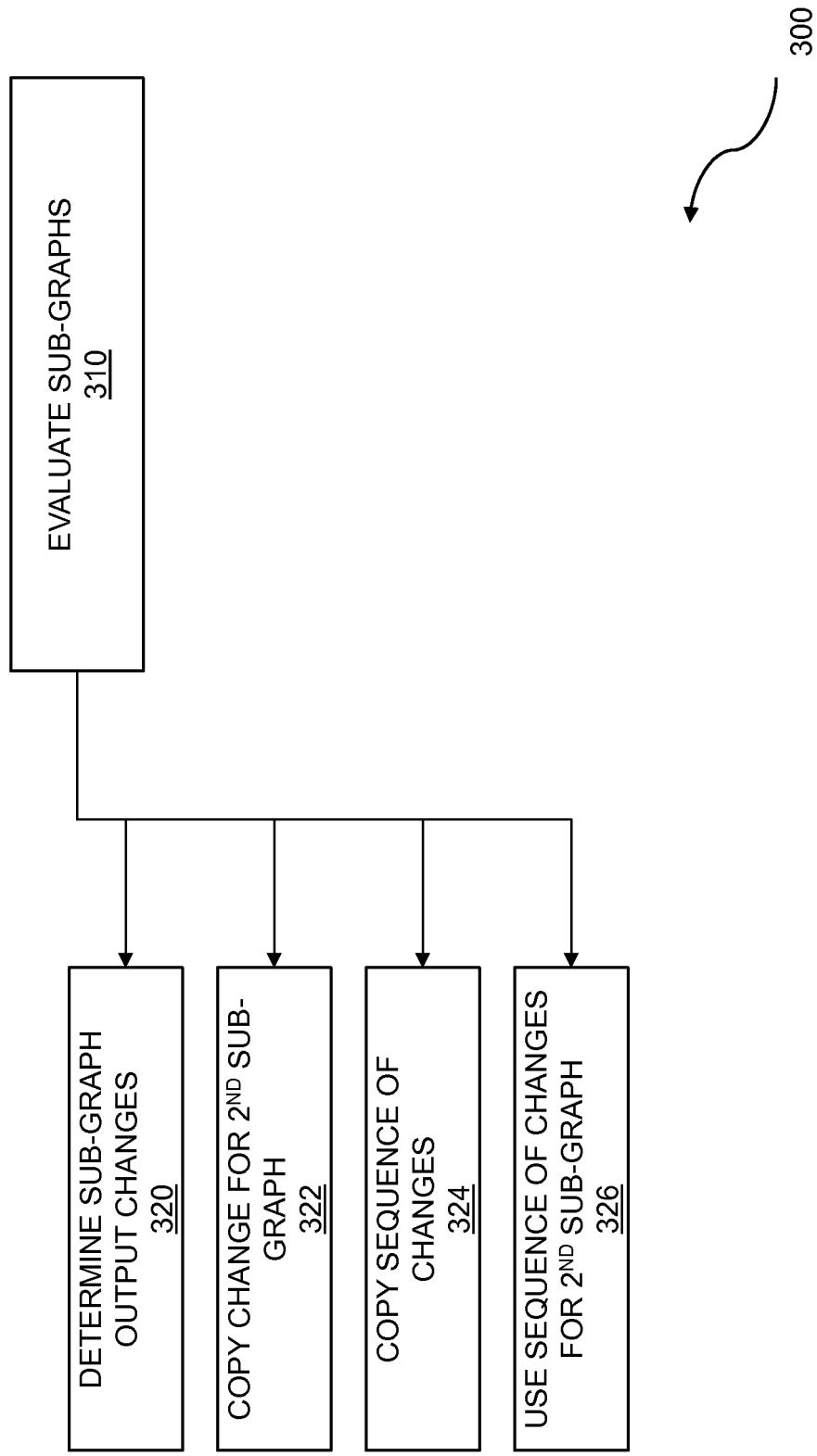
FIG. 3 is a flow diagram for sub-graph usage.

FIG. 3 is a flow diagram for sub-graph usage. A flow 300 may continue or be part of the previous flow 100. In some embodiments, the flow 300 stands on its own and works from pre-existing sub-graphs. A graph representing a system design is obtained. A graph may be portioned into sub-graphs. Sub-graphs may be used for various aspects of evaluation and simulation processes. A simulation sequence may trigger evaluation of one or more primitives. Evaluation may be based on input changes to one or more sub-graphs. Evaluation may result in updating the values at the outputs of the primitives.

The sub-graphs are evaluated 310 as part of simulation of a high-level design. Simulation of a graph may comprise one or more optimization criteria, including use of massively parallel architectures, selective execution of a parallel simulation, aggregated selective evaluation optimization for memory architecture, exploitation of SIMD instructions, and the like.

Simulation sequences for a design may be formed from sub-graphs. For example, simulation sequences may create regions large enough to keep a parallel machine busy, but the regions may not be so large that computation becomes inefficient due to unnecessary checking or execution. In embodiments, if a design were to have multiple clock regions corresponding to each clock's flip-flops/latches, then the primitives that produce the inputs to the flip-flops/latches may be formed into two regions.

A simulation sequence may trigger evaluation of one or more primitives based on input changes. The evaluation may result in updating (e.g. changes to) the values at the outputs of the primitives. The output changes may result in one or more input changes to downstream logic. The flow 300 may further comprise determining that an output of one of the sub-graphs has changes 320 state and copying that change of state 322 to a processor. A process for a second sub-graph may use that change of state as input to the second sub-graph. The second sub-graph may represent another portion of the design being simulated. Because of the change of input state of a second sub-graph, a simulation sequence may be triggered.

Similar to the copying which may take place between an output change and an input change, the flow 300 may further comprise copying a sequence of changes of state 324 for that output of one of the sub-graphs and using this sequence as a series of inputs to the second sub-graph 326. A sequence of changes of state may result from one or more simulation steps of a sub-graph. The series of changes of state may represent one or more evaluation steps. The copying of a sequence of changes of state from an output of a sub-graph that may be used as a sequence of inputs to a second sub-graph may execute more efficiently if a first sub-graph and a second sub-graph are executed on the same processor, for example. Various steps in the flow 300 may be changed in order, repeated, omitted, or the like without departing from the disclosed inventive concepts. Various embodiments of the flow 300 may be included in a computer program product embodied in a non-transitory computer readable medium that includes code executable by one or more processors.

Figure 4:
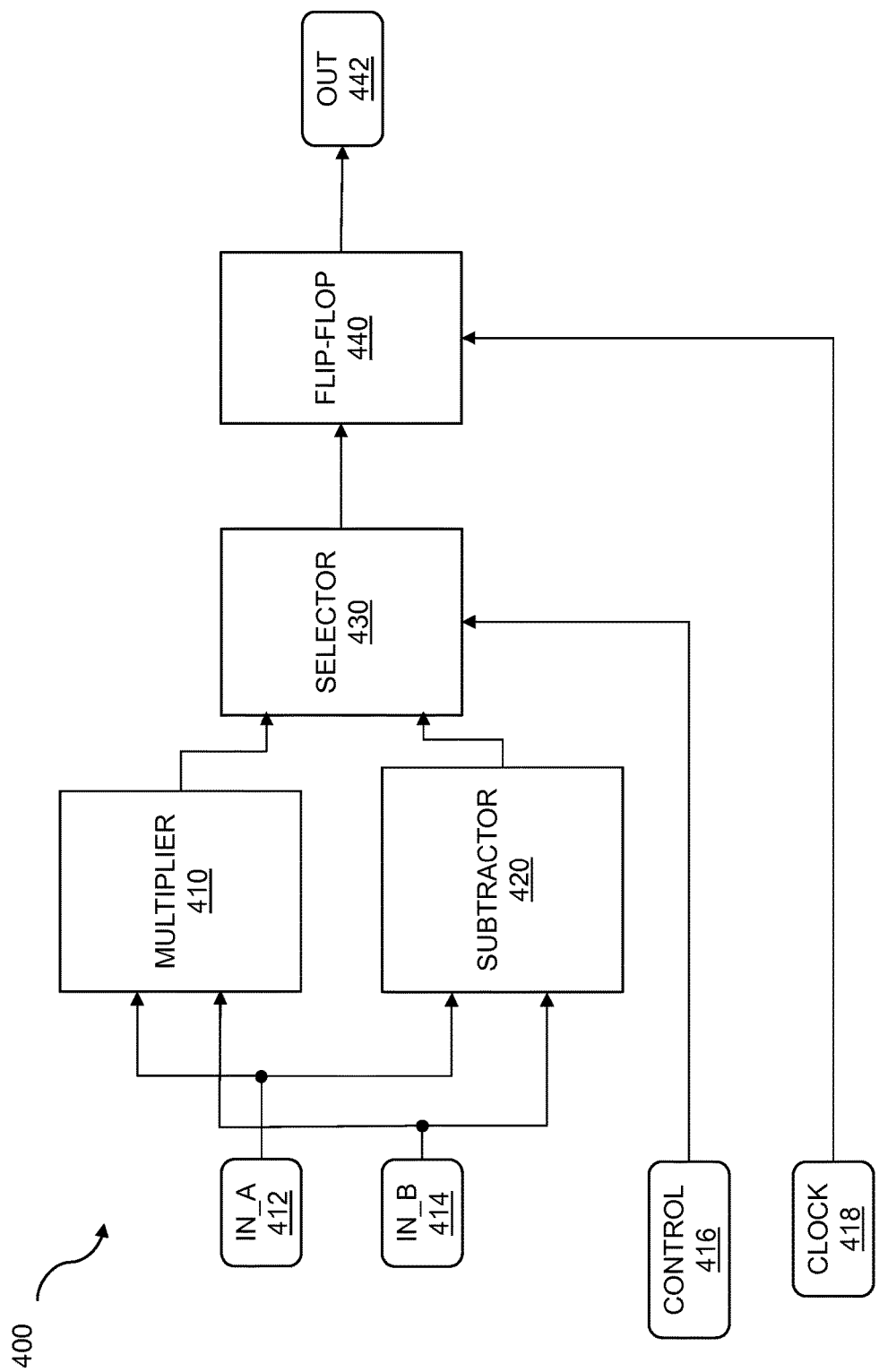
FIG. 4 is an example logic block diagram.

FIG. 4 is an example logic block diagram 400. Simple primitives may have roughly equal computational and communication requirements. A gate level description of a logic design may be in terms of simple primitives such as AND, OR, and NOR gates, flip flops, latches, and the like. Register transfer level (RTL) and higher-level descriptions may be decomposed into simple primitives such as adders, multipliers, multi-bit and/or, selectors, multi-bit flip-flops, latches, state holding processes with arbitrary controls, loops with controls, etc. A description may be evaluated at various levels of abstraction. In embodiments, the evaluating may be based on an oblivious simulation model.

A high-level or system-level description of a design may be partitioned for ease of evaluation. For example, a given RTL Description in Verilog™, VHDL™, SystemVerilog™, SystemC™, or other design language, may be decomposed into primitives. A system design may be composed of hundreds of thousands of statements. The statements may form primitives. Primitives such as multipliers, adders, etc. of an arbitrary width may be decomposed into components that have a fixed width such as 32 or 64 bits. Primitives such as Selectors that have an arbitrary number of inputs may be decomposed into components that have a fixed number of inputs, such as 3 or 5. For example, in a given HDL description, the description may be decomposed into simple primitives with suitable a number of inputs and widths, as well as sufficient complexity of operation.

In the example logic block 400, various inputs may be applied to the logic. For example, the logic may have inputs such as IN_A 412 and IN_B 414. The inputs IN_A and IN_B may be applied to one or more gates comprising the logic block 400. Control signals may also be applied to a logic block. For example, a control signal Control 416, and a clock signal Clock 418 may be among a plurality of control signals which may be applied to the control block.

Various operations may be performed on the one or more inputs applied to a logic block. For example, a multiplier 410 and a subtractor 420 may operate upon inputs 412 and 414. In embodiments, any number of operations may be performed on inputs. Outputs of a multiplier 410 and a subtractor 420, or other logic function or functions, may be connected to another logic block such as a selector 430. A selector 430 may be controlled by a control signal Control 416. Continuing with the example, an output of a selector 430 may be captured into a flip-flop 440. A flip-flop 440 may be controlled by a clock signal Clock 418. The clock signal Clock 418, applied to a flip-flop, may generate an output OUT 442. The output OUT 442 may be connected to one or more logic blocks for design and/or simulation purposes.

Figure 5:
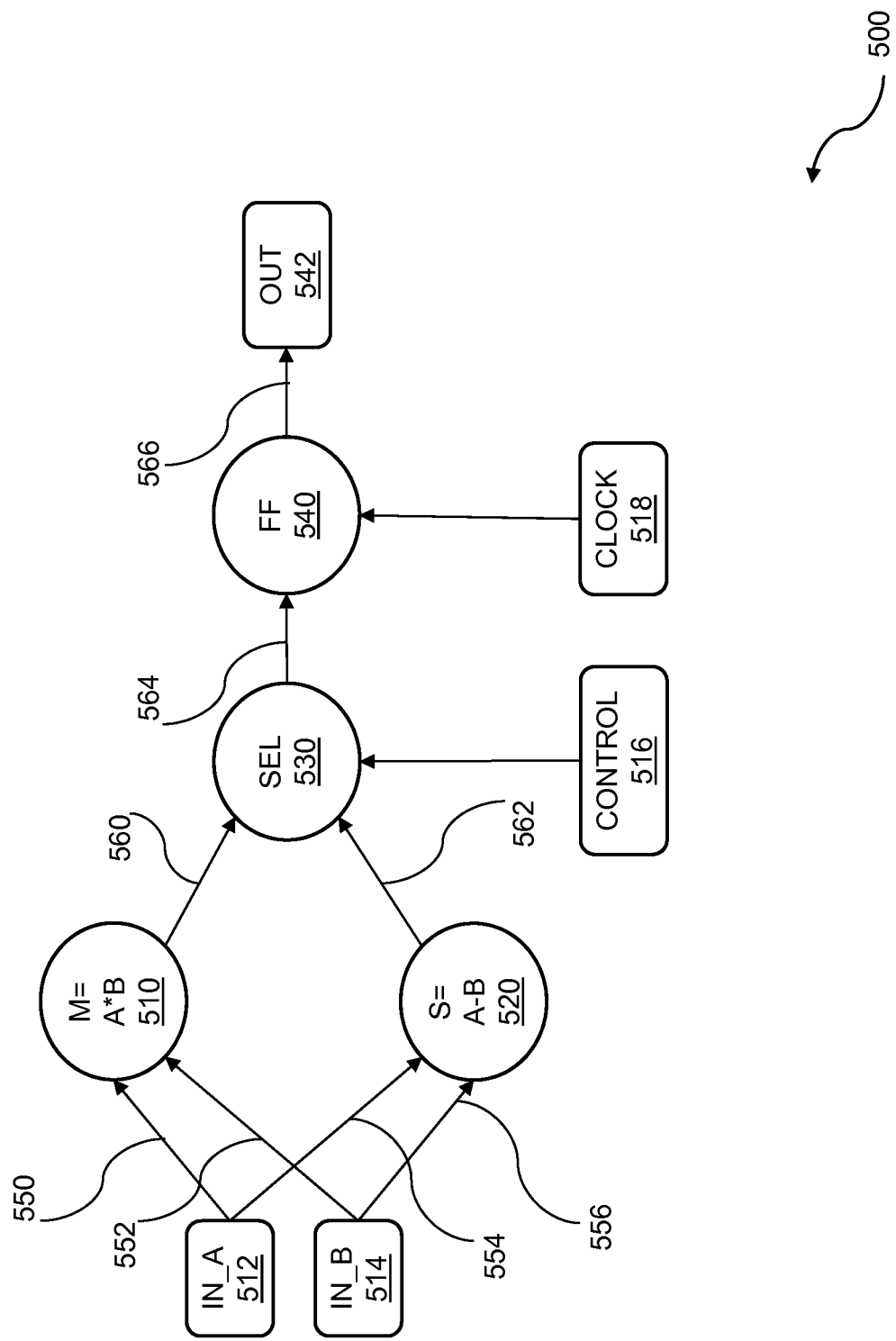
FIG. 5 is an example flow graph of the logic design.

FIG. 5 is an example flow graph 500 of the logic design. The flow graph 500 may represent the logic block diagram 400. A high-level design may be mapped onto a graph. By determining a map representation, operators of a logic design may be mapped to nodes of a graph, and interconnections of a logic design to arcs of a graph. A graph may define inputs and outputs to the graph. A graph may include a control data flow graph, directed graph, an acyclic directed graph, a Petri Net, or other graph appropriate to the design problem. A control data flow graph may include a graph of a combinational region of the high-level design and a state region of the high-level design. A graph of a combinational region and a state region may be suitable to various verification and simulation purposes.

The graph 500 comprises inputs IN_A 512, IN_B 514, CONTROL 516, and CLOCK 518. The input 512 and the input 514 may be connected by an arc 550 and an arc 552 to node M=A*B 510, and by an arc 554 and an arc 556 to node S=A−B 520. In embodiments, arcs to one or more nodes may connect one or more inputs. Continuing, the node 510 and the node 520 may be connected by the arc 560 and the arc 562 to a node SEL 530. The node 530 may be controlled by a control signal Control 516. Continuing, the node 530 may be connected by an arc 564 to a node FF 540. In embodiments, the node FF 540 may represent a flip-flop. A node 540 may be controlled by a control signal Clock 518. A node 540 may be connected by an arc 566 to an output OUT 542. In embodiments, a clock signal Clock 518 controlling a node 540 may also control an output 542. Logic blocks may be of varying sizes, ranging from a single input, operator, and output, for example, to many inputs, many operators, and many outputs. Large graphs, for example, may be partitioned into a series of sub-graphs for simulation purposes and/or design purposes.

Figure 6:
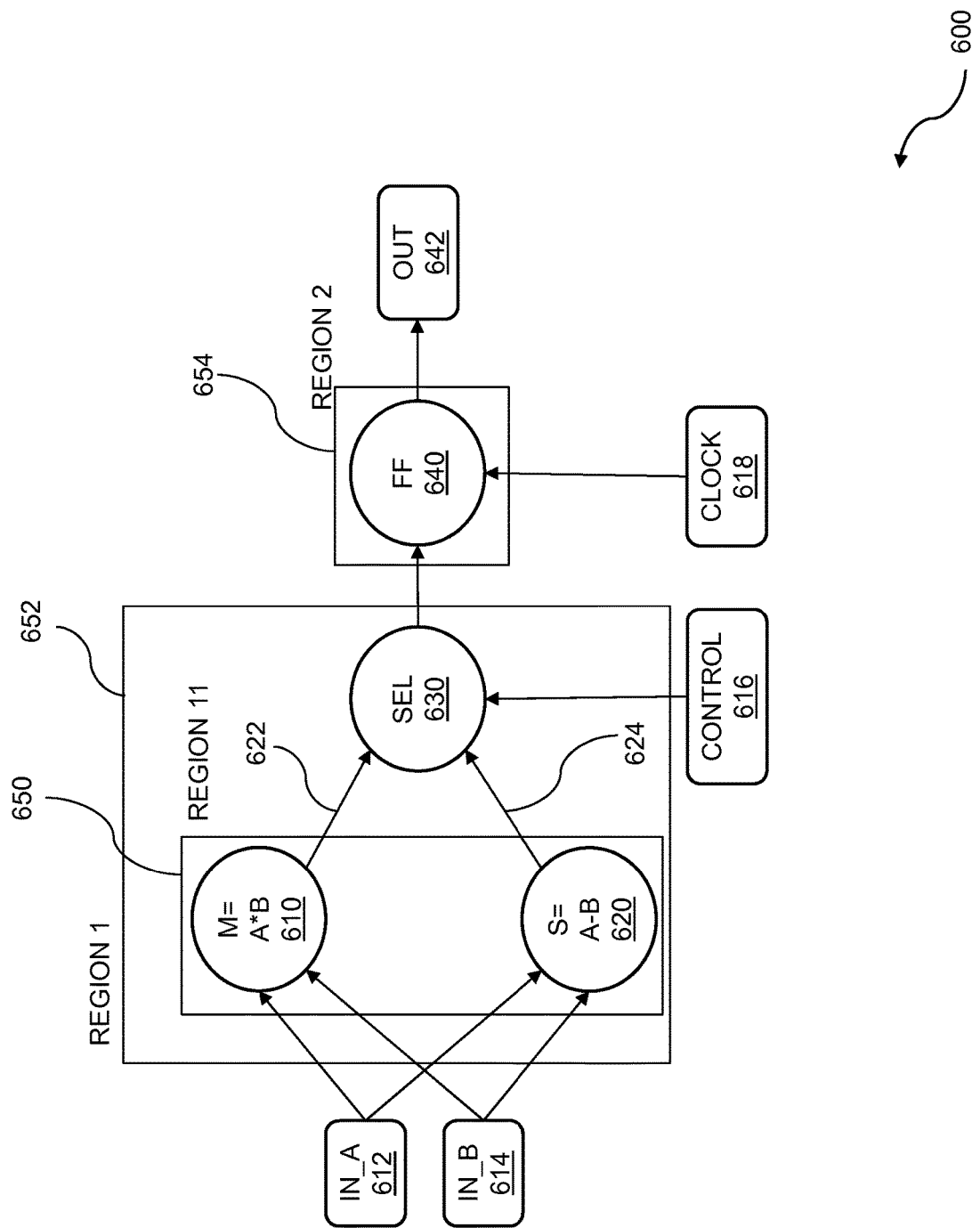
FIG. 6 is an example flow graph showing example partitions.

FIG. 6 is an example flow graph showing example partitions. The example flow graph with partitions 600 may be derived from the flow graph 500. A graph may be generated as part of a computer-implemented method for design simulation. A graph may be represented by any of a variety of graphical methods such as a directed graph, an acyclic directed graph, a Petri Net, or other graph appropriate to the design problem. The control data flow graph may include a graph of a combinational region of the high-level design and a state region of the high-level design. A graph may be partitioned into simulation sequences. A simulation sequence may trigger evaluation of one or more primitives based on changes to an input or inputs. Evaluation may result in updating the values at the outputs of the primitives. A simulation sequence may be constructed for the flow graph with partitions 600.

A simulation sequence may trigger evaluation of one or more primitives based on input changes. A simulation sequence may result in updating values at an output or outputs of one or more primitives. For example, for the graph 600, the following simulation sequence may be constructed. If a change occurs on IN_A 612, IN_B 614, or Control 616, then Region 1 652 is evaluated. If a change occurs on, for example, a positive edge of Clock 618, then Region 2 654 is evaluated. More than one simulation sequence may be generated. For example, one of many alternative sequences may comprise the following. If a change occurs on any of IN_A 612 and IN_B 614, then Region 11 650 is evaluated. Evaluating 650 may result in evaluating M=A*B 610 and S=A−B 620. If a change occurs on arc 622, arc 624 or Control 616, then SEL 630 is evaluated. If a change occurs on, for example, a positive edge of Clock 618, then Region 2 654 is evaluated. Evaluating 654 may result in evaluating a flip-flop FF 640. Evaluating 640 may result in evaluating output OUT 642.

Simulation sequences for a given design may be formed to create regions large enough to keep a parallel machine busy but not so large that unnecessary checking or execution is performed. Unnecessary checking or execution may result in excess computational utilization and thus may reduce efficiency. If a design comprises multiple clock regions that may correspond to flip-flops/latches connected to each clock, then primitives which may produce inputs to a flip-flop/latch may be formed into regions.

Figure 7:
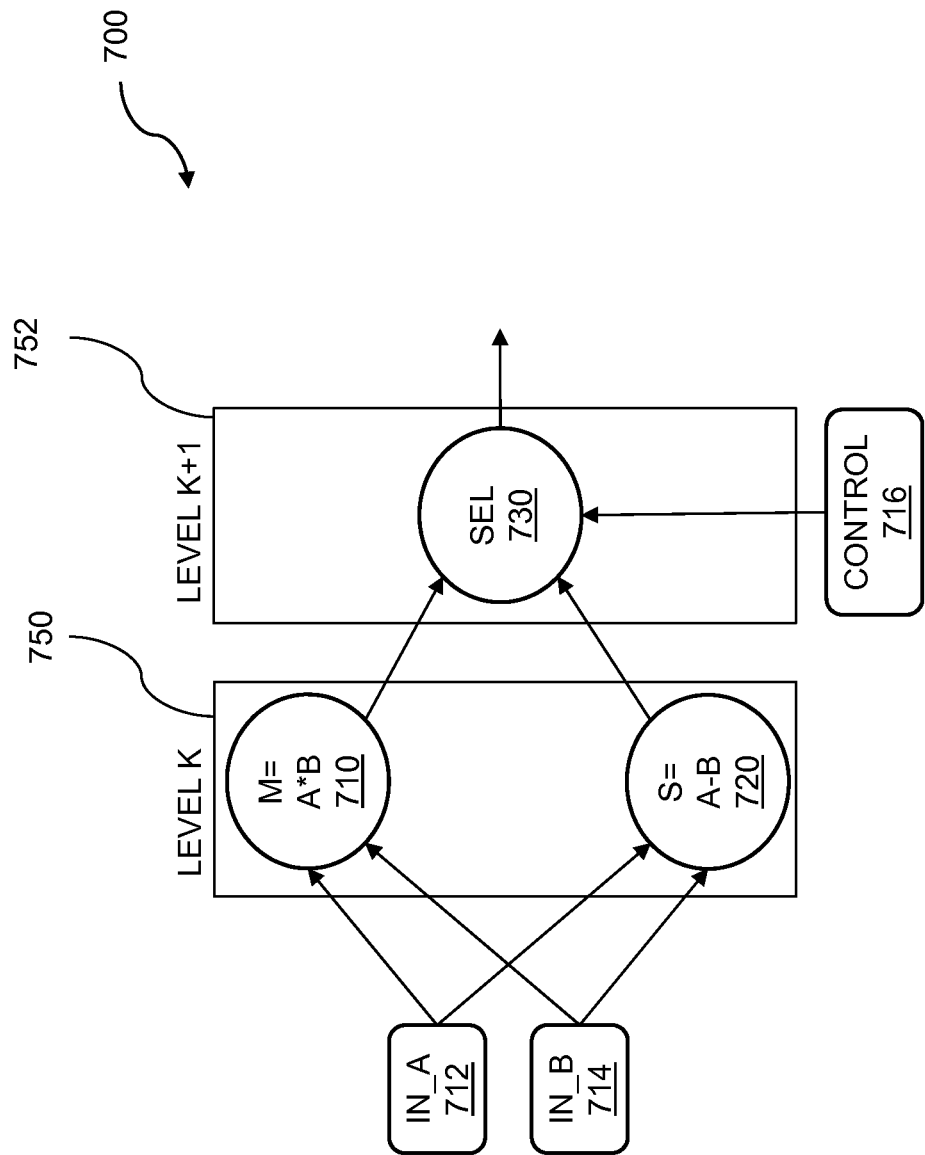
FIG. 7 is an example levelized hypergraph.

FIG. 7 is an example of a levelized hypergraph 700. The levelized hypergraph 700 may represent a portion of the flow graph with partitions 600. A region as discussed above may comprise an interconnection of primitives which may form a hypergraph. A hypergraph may comprise a series of sub-graphs. A typical region may be acyclic. In embodiments, a region which may have a combinational cycle may be partitioned such that a cycle may be cut at an arbitrary point. A special primitive in a special region may be inserted at the point of the cut or at another location. By inserting a special primitive, all regions may be turned into acyclic hypergraphs.

An acyclic hypergraph for simulation may comprise a subset of sub-graphs. The subset of the sub-graphs for simulation may be selected based on the input-change bit for each sub-graph in the subset of the sub-graphs being set to true. An acyclic hypergraph may be levelized in such a manner that each level may have a set of primitives which may not have value dependencies. In a levelized hypergraph 700, an operation M=A*B 710, and an operation SA-B 720 may not have one or more value dependencies. For example, operations 710 and 720 may depend on inputs IN_A 712 and IN_B 714, but not on each other. In the example given, operations 710 and 720 may be evaluated in the same level Level K 750. A SEL 730 primitive may have value dependencies on operations 710 and 720, and control signal Control 716, and may be evaluated in a level Level K+1 752. Such a dependency may be permitted if the operations 710 and 720 are evaluated in a previous level 750 prior to the evaluation of level 752. Such a procedure may avoid time/event ordered queues, and synchronization of queues. There may be a single synchronization for each level if an oblivious simulation model is used.

A subset of sub-graphs may be selected by other means. In embodiments, the selection may further comprise using one or more of the input change bits on a level as part of the selecting of the subset for simulation. Input change bits may be used to indicate that one or more of the inputs, for example, if inputs 712 and 714 have changed. In other embodiments, the partitioning of a graph into sub-graphs may include the balancing of levels. Balancing of levels may permit more efficient simulation and evaluation on GPUs or other parallel processing chips and systems. In another embodiment, the partitioning may include separating primitives evenly across clusters within a level. Again, such separation may serve to improve computation efficiency of simulation and evaluation processes.

Figure 8:
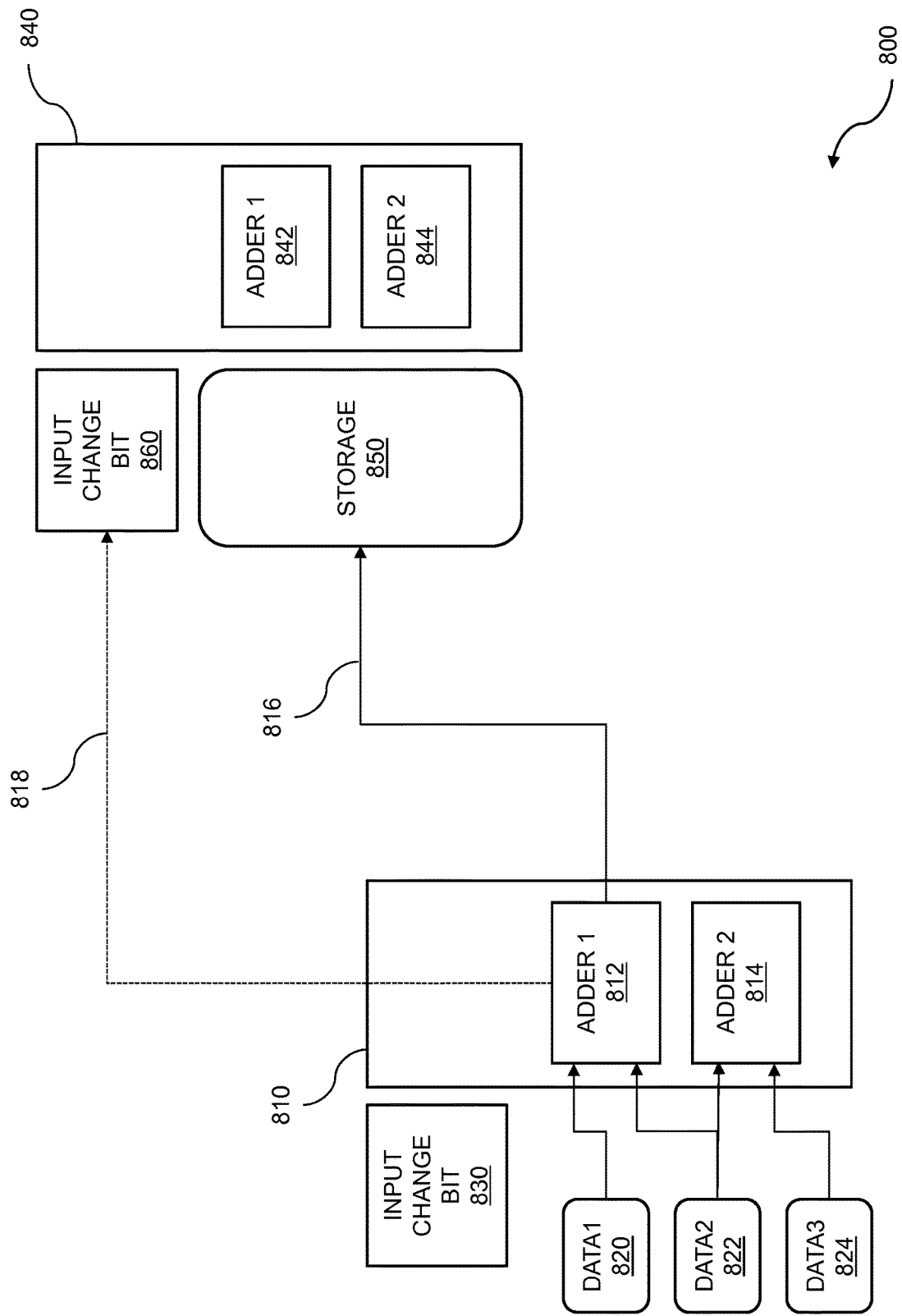
FIG. 8 is an example logic block for selective evaluation.

FIG. 8 is an example logic block 800 for selective evaluation. The logic block 800 is shown which may include input change bits. Input change bits may indicate changes of input values for one or more inputs, and may refer to changes for a single gate or a plurality of gates. The input change bits may be included for the purposes of simulation, and/or may reflect alterations to a hardware design. Recall that oblivious simulation may have an advantage over event driven simulation in that oblivious simulation proceeds without creating and maintaining an event queue required by event driven simulation. However, oblivious simulation may tend to simulate all elements rather than just those which experience an input change. The input change bits may be added in order to simulate only those elements which experience input changes (e.g. selective simulation), and may render simulation more computationally efficient.

A selective evaluation procedure may require that input changes be maintained for each primitive of a block of primitives. For example, the logic block 800 may show two primitives, 810 and 840, each with their own Input Change Bit, 830 and 860 respectively. A single input change bit may be assigned to a logic block comprising primitives, in a given simulation level, grouped together to reduce the overhead of maintaining individual input change bits. A single input change bit may indicate a change of one or more inputs into a block. Simulation of a block may only proceed if an input change bit indicates a change.

In the given example logic block 800, a single common input change value 830 may be maintained for a primitive 810. Selectively evaluating the processes may be based on an input change bit set being set to true. If one or more inputs Data1 820, Data2 822, and Data3 824 changes, a common input change bit 830 may be set. setting an input change bit 830 may result in evaluation of all primitives, Adder1 812 and Adder2 814, in block 810. For example, if Data1 820 transitions while Data2 822 and Data3 824 remain constant, then an input change bit 830 would be set to indicate that an input had changed, and primitives 812 and 814 would be evaluated.

Continuing, consider, for example, that a change on Data1 820, which may cause evaluation of primitives 812 and 814, may cause the output of Adder1 812 to change. Such a change may be reflected on input 816 to storage 850. Also, a change may result in an update 818 of Input Change Bit 860. During a subsequent simulation step, the primitives of block 840 may be evaluated as a result of an input change 816—stored in storage 850 and indicated by input change bit 860.

In embodiments, an example procedure may include the steps in Table 1.

TABLE 1

Example handling steps for circuit with input change bits.

Check input change bit value
If input change bit value is "1", evaluate blocks of primitive
Set input change bit for block to "0" (reset)
Evaluate the primitives of a block - this may cause an output change and TABLE 1-continued Example handling steps for circuit with input change bits.

may trigger a process
Write output value to receivers
Write output change to receiving block or blocks.

Writing of an output change to an Input Change Bit 860 of block 840 may result in evaluation of primitives Adder1 842 and Adder2 844 of block 840.

A procedure such as the one indicated in the example may balance the workload in three phases. In the example, the three phases may comprise fetching of input values, evaluation of primitives, and checking and writing of output changes. A procedure such as the one indicated in the example may optimize memory access by fetching input values for a given logic block as a single contiguous region of memory. Since only blocks which undergo input changes may be evaluated, redundant evaluation may be reduced in comparison to a conventional Oblivious simulation.

Figure 9:
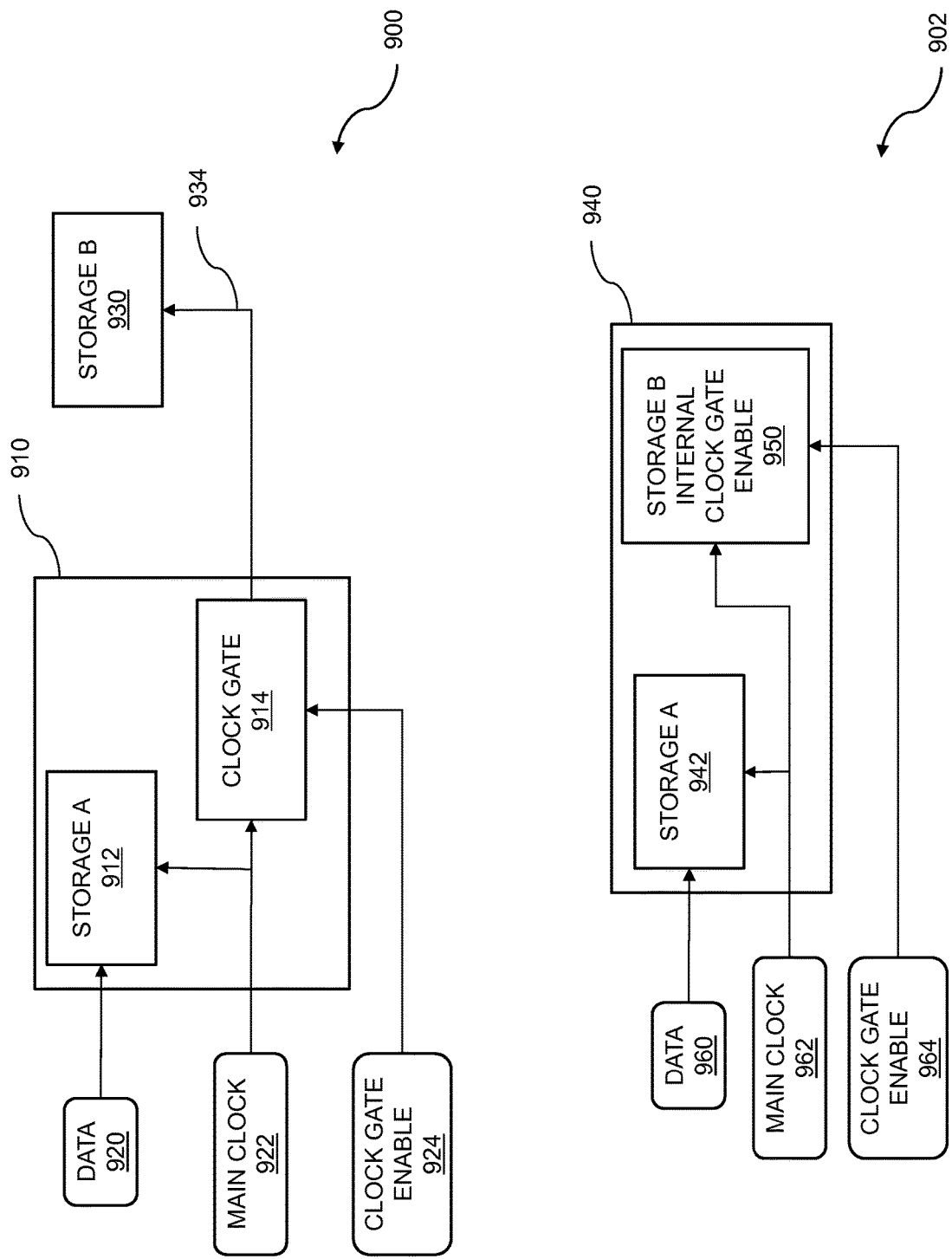
FIG. 9 is an example logic combination to phase reduction.

FIG. 9 is an example logic combination to create a phase reduction. A logic block 900 may be obtained for simulation by a computer-implemented method for design simulation. Gated clock designs, such as logic block 900, may result from a variety of design decisions. For example, a gated clock 934 may be derived from a Main Clock 922 (e.g. system clock) and may be implemented to disable regions of a design under a clock control. The main clock 922 may also permit capture of Data 920 into a storage element 912. In some designs, each gated clock may in turn be used to derive sub-gated clocks, and so on. Such a hierarchy of gated clocks may permit serialization of evaluation of a given simulation model. In some designs, a gated clock may be enabled by an enable signal 924.

An enable 924 may control the Clock Gate 914 of a gated clock 934. A gated clock 934 may be computed in one phase 910. An enable 924 of a gated clock 934 may be computed in one phase 910, and may trigger a change on gated clock 934 which may be evaluated in a second phase. For example, a change on gated clock 934 may cause evaluation of Storage B 930.

An example logic combination may include modifying clock gating. The modifying of the clock gating may include moving gating to storage elements. For example, if a clock gating check were moved to a storage element that is controlled by a clock, then evaluation may be accomplished in one phase. For example, consider a logic block 902. A clock enable gate has been moved into a storage element 950. The modifying of the clock gating may include eliminating a clock gate to a combinational logic portion. In embodiments, the modifying of the clock gating may only be for simulation purposes. As with logic block 900, logic block 902 retains inputs Data 960, Main Clock 962, and Clock Gate Enable 964. However, in the example, a Main Clock 962 may be connected to two storage elements 942 and 950. The clock gating may be restructured to combine phases and to occur on the active edge of clock. Since a clock enable gate may be moved into a storage element 950, then two primitives 942 and 950 may be combined into a single phase 940, thus reducing the number of phases required for simulation to one. Reducing the number of simulation phases required may increase parallel evaluation and may remove computational overhead of starting additional phases.

Figure 10:
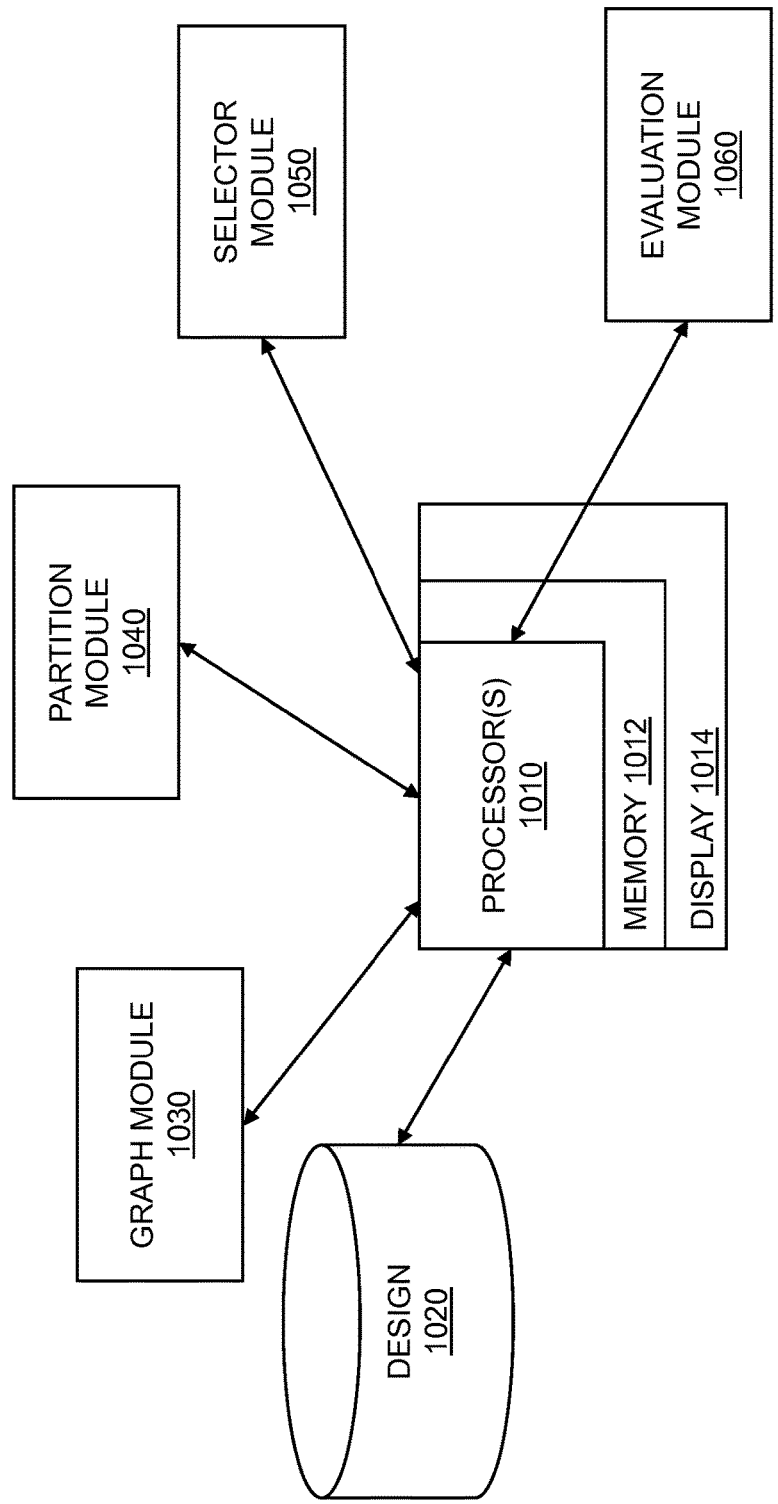
FIG. 10 is a system diagram for partitioned simulation.

FIG. 10 is a system diagram for partitioned simulation. In embodiments, the computer system 1000 for partitioned design simulation may comprise one or more processors 1010 coupled to a memory 1012 and a display 1014. The one or more processors 1010 may be coupled to a Design Library 1020, a Graph Module 1030, a Partition Module 1040, a Selector Module 1050, and an Evaluation Module 1060. In at least one embodiment, the one or more processors 1010 may accomplish the one or more of the graph, partition, selector, and evaluation functions. In at least one embodiment, all of these functions will be accomplished by the one or more processors 1010.

The one or more processors 1010 are coupled to the memory 1012 which stores instructions, system support data, intermediate data, analysis, and the like. The one or more processors 1010 may be coupled to an electronic display 1014. The display 1014 may be any electronic display, including but not limited to, a computer display, a laptop screen, a net-book screen, a tablet computer screen, a cell phone display, a mobile device display, a remote with a display, a television, a projector, or the like.

The one or more processors 1010 may be configured to obtain a high-level design 1020 for simulation. The high-level design may comprise various aspects of a design including a system to be simulated, a simulation test bench, simulation models, simulation vectors, and the like.

The system 1000 may be configured to determine a graph representation for the high-level design 1030. A control data flow graph (CDFG) may be determined for an RTL representation of a high-level design. The CDFG may be folded into a graph of a combinational region and a state region. Other graphical representations may be determined for a representation of a high-level design including a directed graph an acyclic directed graph, a Petri Net, or other graph appropriate to the design problem.

The system 1000 may be configured to partition the graph into sub-graphs. A graph may be partitioned into sub-graphs by a variety of means including static means, arbitrary means, and the like. Static partitioning, for example, may be based on creating value read/write locality, balancing of computation by level, creating event-change locality, reducing unique node (or primitive) types in a given partition, and the like. Arbitrary partitioning may be based on random, ad hoc, heuristic, and other means, for example.

The system 1000 may be configured to select a subset of the sub-graphs for simulation based on input-change bits. A partition or subset of a graph may be instrumented with an input change bit. An input change bit may be associated with a vertex (node) of a graph, or may be associated with a cluster of nodes of a graph. An input change bit may indicate that one or more inputs to a partition or subset of a graph (e.g. a sub-graph) have changed over some time period. Selection of a subset of sub-graphs may be made based on a change in status of one or more input change bits.

The system 1000 may be configured to and evaluate the subset of the sub-graphs to produce a simulation result for the high-level design. A subset of sub-graphs may be simulated based on a change of status of one or more input change bits. Other subsets of sub-graphs may indicate that there may have been no change of status of one or more input change bits. Thus, selective simulation of, for example, only subsets of sub-graphs that had a change of status of one or more input change bits may reduce computational complexity by ignoring subsets of sub-graphs that did not have a change of status of one or more input change bits.

The system 1000 may include computer program product comprising code for obtaining a high-level design for simulation; code for determining a graph representation for the high-level design; code for partitioning the graph into sub-graphs; code for selecting a subset of the sub-graphs for simulation based on input-change bits; and code for evaluating the subset of the sub-graphs to produce a simulation result for the high-level design.

Each of the above methods may be executed on one or more processors on one or more computer systems. Embodiments may include various forms of distributed computing, client/server computing, and cloud based computing. Further, it will be understood that the depicted steps or boxes contained in this disclosure's flow charts are solely illustrative and explanatory. The steps may be modified, omitted, repeated, or re-ordered without departing from the scope of this disclosure. Further, each step may contain one or more sub-steps. While the foregoing drawings and description set forth functional aspects of the disclosed systems, no particular implementation or arrangement of software and/or hardware should be inferred from these descriptions unless explicitly stated or otherwise clear from the context. All such arrangements of software and/or hardware are intended to fall within the scope of this disclosure.

The block diagrams and flowchart illustrations depict methods, apparatus, systems, and computer program products. The elements and combinations of elements in the block diagrams and flow diagrams, show functions, steps, or groups of steps of the methods, apparatus, systems, computer program products and/or computer-implemented methods. Any and all such functions—generally referred to herein as a "circuit," "module," or "system"—may be implemented by computer program instructions, by special-purpose hardware-based computer systems, by combinations of special purpose hardware and computer instructions, by combinations of general purpose hardware and computer instructions, and so on.

A programmable apparatus which executes any of the above mentioned computer program products or computer-implemented methods may include one or more microprocessors, microcontrollers, embedded microcontrollers, programmable digital signal processors, programmable devices, programmable gate arrays, programmable array logic, memory devices, application specific integrated circuits, or the like. Each may be suitably employed or configured to process computer program instructions, execute computer logic, store computer data, and so on.

It will be understood that a computer may include a computer program product from a computer-readable storage medium and that this medium may be internal or external, removable and replaceable, or fixed. In addition, a computer may include a Basic Input/Output System (BIOS), firmware, an operating system, a database, or the like that may include, interface with, or support the software and hardware described herein.

Embodiments of the present invention are neither limited to conventional computer applications nor the programmable apparatus that run them. To illustrate: the embodiments of the presently claimed invention could include an optical computer, quantum computer, analog computer, or the like. A computer program may be loaded onto a computer to produce a particular machine that may perform any and all of the depicted functions. This particular machine provides a means for carrying out any and all of the depicted functions.

Any combination of one or more computer readable media may be utilized including but not limited to: a non-transitory computer readable medium for storage; an electronic, magnetic, optical, electromagnetic, infrared, or semiconductor computer readable storage medium or any suitable combination of the foregoing; a portable computer diskette; a hard disk; a random access memory (RAM); a read-only memory (ROM), an erasable programmable read-only memory (EPROM, Flash, MRAM, FeRAM, or phase change memory); an optical fiber; a portable compact disc; an optical storage device; a magnetic storage device; or any suitable combination of the foregoing. In the context of this document, a computer readable storage medium may be any tangible medium that can contain or store a program for use by or in connection with an instruction execution system, apparatus, or device.

It will be appreciated that computer program instructions may include computer executable code. A variety of languages for expressing computer program instructions may include without limitation C, C++, Java, JavaScript™, ActionScript™, assembly language, Lisp, Perl, Tcl, Python, Ruby, hardware description languages, database programming languages, functional programming languages, imperative programming languages, and so on. In embodiments, computer program instructions may be stored, compiled, or interpreted to run on a computer, a programmable data processing apparatus, a heterogeneous combination of processors or processor architectures, and so on. Without limitation, embodiments of the present invention may take the form of web-based computer software, which includes client/server software, software-as-a-service, peer-to-peer software, or the like.

In embodiments, a computer may enable execution of computer program instructions including multiple programs or threads. The multiple programs or threads may be processed approximately simultaneously to enhance utilization of the processor and to facilitate substantially simultaneous functions. By way of implementation, any and all methods, program codes, program instructions, and the like described herein may be implemented in one or more threads which may in turn spawn other threads, which may themselves have priorities associated with them. In some embodiments, a computer may process these threads based on priority or other order.

Unless explicitly stated or otherwise clear from the context, the verbs "execute" and "process" may be used interchangeably to indicate execute, process, interpret, compile, assemble, link, load, or a combination of the foregoing. Therefore, embodiments that execute or process computer program instructions, computer-executable code, or the like may act upon the instructions or code in any and all of the ways described. Further, the method steps shown are intended to include any suitable method of causing one or more parties or entities to perform the steps. The parties performing a step, or portion of a step, need not be located within a particular geographic location or country boundary. For instance, if an entity located within the United States causes a method step, or portion thereof, to be performed outside of the United States then the method is considered to be performed in the United States by virtue of the causal entity.

While the invention has been disclosed in connection with preferred embodiments shown and described in detail, various modifications and improvements thereon will become apparent to those skilled in the art. Accordingly, the forgoing examples should not limit the spirit and scope of the present invention; rather it should be understood in the broadest sense allowable by law.

What is claimed is:

1. A computer-implemented method for simulation of an integrated circuit design comprising:

obtaining a high-level design for simulation;
determining a graph representation for the high-level design;
partitioning the graph representation into sub-graphs, wherein the partitioning the graph representation into sub-graphs comprises determining sub-graphs based on levels of logic where the levels of logic are successive stages having sets of primitives with no value dependencies;
selecting a subset of the sub-graphs for simulation based on input-change bits; and
evaluating the subset of the sub-graphs to produce a simulation result for the high-level design; and
modifying clock gating.

2. The method of claim 1 further comprising propagating the simulation result, based on the evaluating of the subset of the sub-graphs, to a remainder of the graph representation for further simulation.

3. The method of claim 1 wherein the subset of the sub-graphs for simulation is selected based on an input-change bit, for each sub-graph in the subset of the sub-graphs, being set to true.

4. The method of claim 1 wherein the partitioning into sub-graphs is based on reducing a number of signals crossing sub-graph boundaries.

5. The method of claim 1 further comprising using one or more of the input-change bits on a level as part of the selecting of the subset of the sub-graphs for simulation.

6. The method of claim 1 wherein the evaluating is based on an oblivious simulation model.

7. The method of claim 6 further comprising allocating processes from the oblivious simulation model to a plurality of processors.

8. The method of claim 7 further comprising selectively evaluating the processes based on an input change bit set being set to valid.

9. The method of claim 1 wherein the graph representation includes a control data flow graph.

10. The method of claim 9 wherein the control data flow graph includes a graph of a combinational region of the high-level design and a state region of the high-level design.

11. The method of claim 1 wherein the partitioning includes creating value locality.

12. The method of claim 1 wherein the partitioning includes creating event change locality.

13. The method of claim 1 wherein the partitioning includes balancing of levels.

14. The method of claim 1 wherein the partitioning includes collecting of readers of a simulation value.

15. The method of claim 1 wherein the partitioning includes separating primitives evenly across clusters within a level.

16. The method of claim 1 wherein the partitioning includes clustering sibling primitives.

17. The method of claim 1 wherein the modifying clock gating includes moving gating to storage elements.

18. The method of claim 17 wherein the modifying clock gating includes eliminating a clock gate to a combinational logic portion.

19. The method of claim 17 wherein the modifying clock gating is only for simulation purposes.

20. The method of claim 1 wherein clock gating is restructured to combine phases and to occur on an active edge of clock.

21. The method of claim 1 further comprising determining that an output of one of the sub-graphs has a change of state and copying that change of state to a processor where a process for a second sub-graph uses that change of state as input to the second sub-graph.

22. The method of claim 21 further comprising copying a sequence of changes of state for that output of one of the sub-graphs and using the sequence as a series of inputs to the second sub-graph.

23. The method of claim 1 further comprising copying the high-level design and simulating the high-level design as well as its copy on at least two different processors.

24. The method of claim 23 wherein the copying is performed to accomplish the simulating.

25. The method of claim 23 further comprising maintaining primitives with the same function in a single cluster within the copy of the high-level design.

26. The method of claim 17 wherein the storage elements each comprise at least one first storage element comprising input data and a second storage element comprising a clock enable signal causing evaluation to be performed in one clock phase.

27. A computer system for simulation of an integrated circuit design, the computer system comprising:
a memory which stores instructions;
one or more processors coupled to the memory wherein the one or more processors are configured to:
obtain a high-level design for simulation;
determine a graph representation for the high-level design;
partition the graph representation into sub-graphs, wherein the partitioning the graph representation into sub-graphs comprises determining sub-graphs based on levels of logic where the levels of logic are successive stages having sets of primitives with no value dependencies;
select a subset of the sub-graphs for simulation based on input-change bits;
evaluate the subset of the sub-graphs to produce a simulation result for the high-level design; and
modify clock gating.

28. A computer program product embodied in a non-transitory computer readable medium for simulation of an integrated circuit design, the computer program product comprising:
code for obtaining a high-level design for simulation;
code for determining a graph representation for the high-level design;
code for partitioning the graph representation into sub-graphs, wherein the code for partitioning the graph representation into sub-graphs comprises code for determining sub-graphs based on levels of logic where the levels of logic are successive stages having sets of primitives with no value dependencies;
code for selecting a subset of the sub-graphs for simulation based on input-change bits;
code for evaluating the subset of the sub-graphs to produce a simulation result for the high-level design; and
code for modify clock gating.

* * * * *